United States Patent
Yuyama

(10) Patent No.: US 10,057,962 B2
(45) Date of Patent: Aug. 21, 2018

(54) PHOTOINTERRUPTERS, OPTICAL SENSORS, AND DRIVING OPERATION DETECTORS

(71) Applicant: CASIO COMPUTER CO., LTD., Tokyo (JP)

(72) Inventor: Masami Yuyama, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/442,788

(22) Filed: Feb. 27, 2017

(65) Prior Publication Data

US 2017/0374723 A1     Dec. 28, 2017

(30) Foreign Application Priority Data

Jun. 24, 2016  (JP) ................................. 2016-125121

(51) Int. Cl.
| | |
|---|---|
| *H05B 37/02* | (2006.01) |
| *G01D 5/347* | (2006.01) |
| *H05B 33/08* | (2006.01) |
| *H01L 31/0203* | (2014.01) |

(52) U.S. Cl.
CPC ....... *H05B 37/0227* (2013.01); *G01D 5/3473* (2013.01); *H01L 31/0203* (2013.01); *H05B 33/0869* (2013.01)

(58) Field of Classification Search
CPC .......................... H05B 37/0227; G01D 5/3473
See application file for complete search history.

(56) References Cited

U.S. PATENT DOCUMENTS

| | | | | |
|---|---|---|---|---|
| 6,296,148 B1* | 10/2001 | Myers | .................... | B67D 7/085 222/71 |
| 6,399,943 B1* | 6/2002 | Sano | .................. | H01L 31/0203 250/239 |
| 7,265,340 B2* | 9/2007 | Minamio | ............ | H01S 5/02208 250/239 |
| 7,586,078 B2* | 9/2009 | Chen | .................... | H03K 17/941 250/214 SW |
| 8,598,509 B2* | 12/2013 | Batchelder | ......... | G01D 5/34715 250/231.13 |
| 2013/0093335 A1* | 4/2013 | Vinkenvleugel | ... | H05B 33/0869 315/158 |

FOREIGN PATENT DOCUMENTS

| | | |
|---|---|---|
| JP | H08-145722 A | 6/1996 |
| JP | H10-047999 A | 2/1998 |
| JP | 2000-088609 A | 3/2000 |
| JP | 2010-073932 A | 4/2010 |
| WO | WO 2011016908 A1 * | 2/2011 ........... H01L 31/167 |
| WO | WO 2011161600 A2 * | 12/2011 ......... H05B 33/0869 |

OTHER PUBLICATIONS

Notification of Reasons for Refusal dated Feb. 27, 2018 received in Japanese Patent Application No. JP 2016-125121 together with an English language translation.

* cited by examiner

*Primary Examiner* — Tung X Le
*Assistant Examiner* — Raymond R Chai
(74) *Attorney, Agent, or Firm* — Scully, Scott, Murphy & Presser, P.C.

(57) ABSTRACT

A photointerrupter includes a light emitter and a light receiver integrally formed with each other. The light emitter includes at least two light sources and emits light. At least one of the at least two light sources are individually tunable in light intensity. The light receiver receives the light from the light emitter.

12 Claims, 7 Drawing Sheets

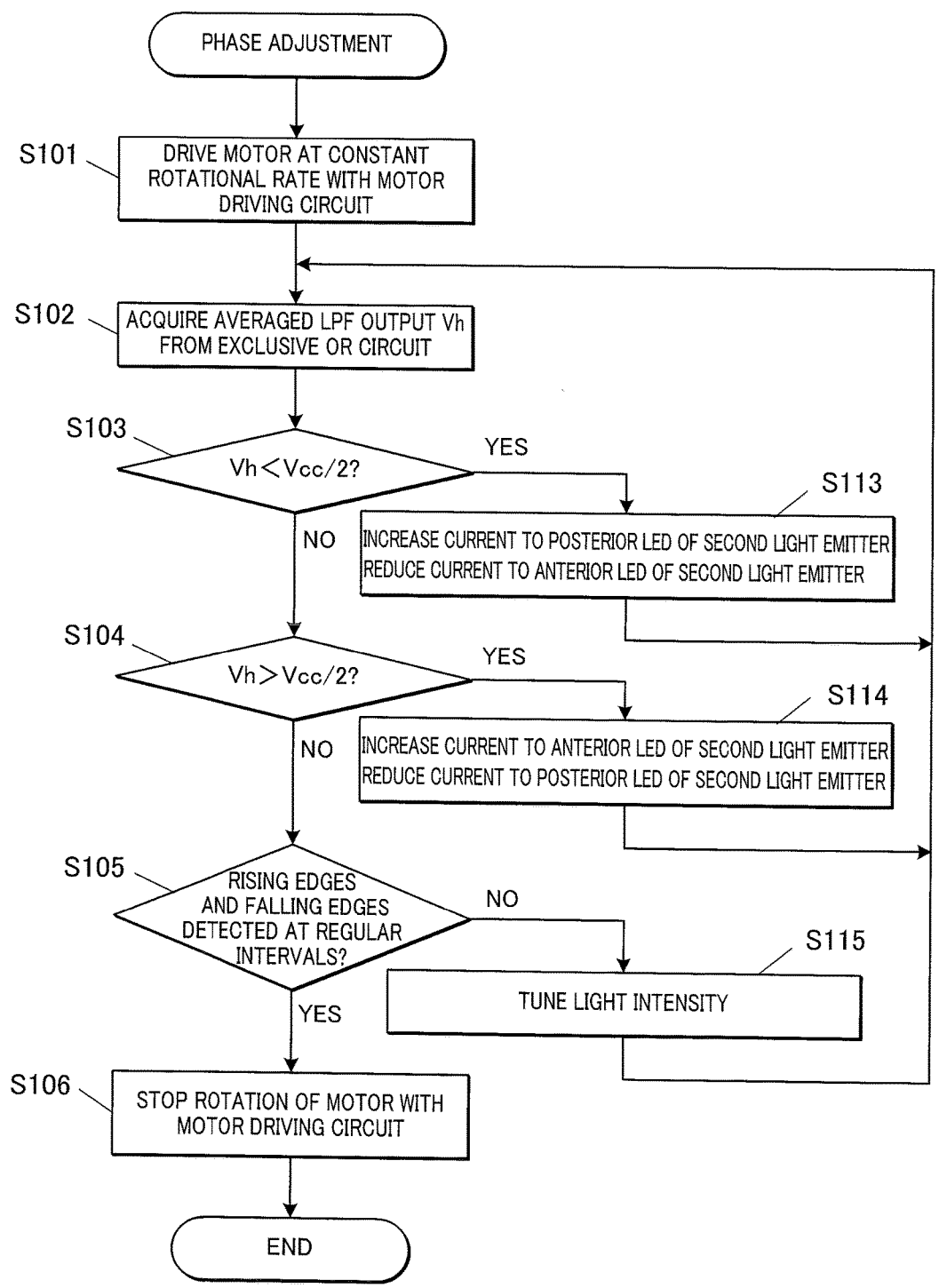

PHOTOINTERRUPTERS, OPTICAL SENSORS, AND DRIVING OPERATION DETECTORS

CROSS-REFERENCE TO RELATED APPLICATIONS

This application is based upon and claims the benefit of priority under 35 USC 119 of Japanese Patent Application No. 2016-125121 filed on Jun. 24, 2016 the entire disclosures of which, including the descriptions, claims, drawings and abstracts, are incorporated herein by reference in their entirety.

BACKGROUND OF THE INVENTION

1. Field of the Invention

The present invention relates to a photointerrupter, an optical sensor, and a driving operation detector.

2. Description of Related Art

There has been known an encoder including photointerrupters each composed of a light emitter and a light receiver combined with each other. The light receivers of the encoder alternately detect transmissions of the light from the light emitters through a certain member or a scale and blockings of the light from the light emitters by the member or scale to determine the position and movement of the object. The scale of the encoder has light blocking segments blocking light and slits transmitting light. The light blocking segments and the slits are alternately disposed at predetermined pitches. The timings of the blockings of the incident light by the light blocking segments (or the timings of the transmissions of the incident light through the slits) are detected at the two photointerrupters positioned with a phase shift to determine the movement and the moving direction of the scale.

The relative position of the two photointerrupters is exactly adjusted to ¼ of the blocking cycle by a light blocking segment. Such two photointerrupters can provide positional information of the object in higher (double or quadruple) precision than a single photointerrupter through the detection of the light blocking cycle based on the timings of the light blockings and the transmissions of the incident light. Japanese Unexamined Patent Application Publication No. Hei 10-47999 discloses a positional adjustment of two photointerrupters with screws based on the intensities of the light to be received at respective light receivers.

SUMMARY OF THE INVENTION

According to an aspect of the present invention, there is provided a photointerrupter including a light emitter and a light receiver integrally formed with each other, wherein the light emitter includes at least two light sources and emits light, at least one of the at least two light sources being individually tunable in light intensity; and the light receiver receives the light from the light emitter.

According to another aspect of the present invention, there is provided an optical sensor including: a photointerrupter including a light emitter and a light receiver integrally formed with each other, wherein the light emitter includes at least two light sources and emits light, at least one of the at least two light sources being individually tunable in light intensity; and the light receiver receives the light from the light emitter; and a light adjuster tuning the light intensities of the at least two light sources, the light adjuster including: a power supply feeding electric power to the photointerrupter; a voltmeter detecting a voltage corresponding to light intensity received at the light receiver; and a power supply controller controlling electric power to be fed from the power supply.

According to another aspect of the present invention, there is provided a driving operation detector including: a first photointerrupter including a first light emitter and a first light receiver integrally formed with each other, wherein the first light emitter emits light; and the first light receiver receives the light emitted from the first light emitter; a second photointerrupter including a second light emitter and a second light receiver integrally formed with each other, wherein the second light emitter includes at least two light sources and emits light, at least one of the at least two light sources being individually tunable in light intensity; and the second light receiver receives the light emitted from the second light emitter; a light adjuster tuning the light intensities of the at least two light sources; and a slit member including transmission regions transmitting light and blocking regions blocking light, the transmission regions and the blocking regions having an identical width, being alternately disposed at regular intervals along a predetermined movement axis, and moving along the movement axis in conjunction with the operation of a driver, and the transmission regions and the blocking regions alternately passing over a first optical path from the first light emitter to the first light receiver and a second optical path from the second light emitter to the second light receiver during movement of the slit member along the movement axis.

BRIEF DESCRIPTION OF THE DRAWINGS

FIG. 7 is a flow chart illustrating the control procedure of a phase adjustment to be executed in the encoder according to the embodiment.

DETAILED DESCRIPTION OF THE PREFERRED EMBODIMENTS

Embodiments of the present invention will now be described with reference to the accompanying drawings.

Figure 1:
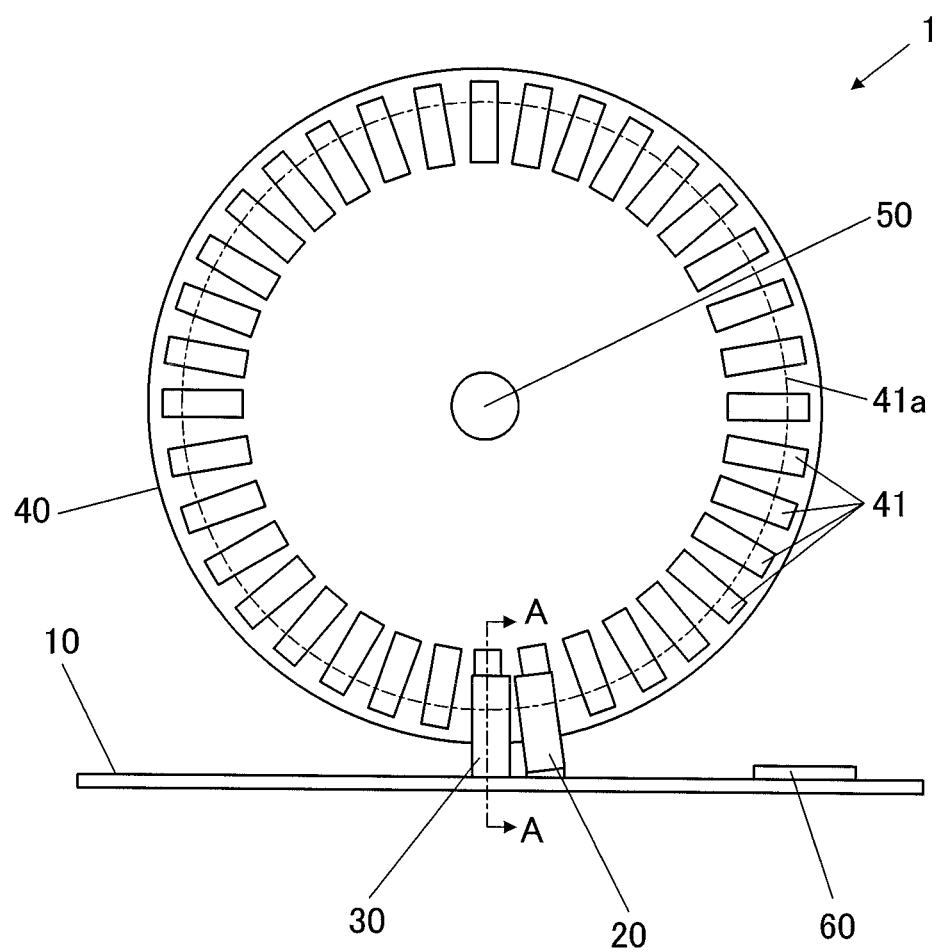
FIG. 1 illustrates a schematic configuration of an encoder according to an embodiment of the present invention.

FIG. 1 is a front view of an encoder 1 functioning as a driving operation detector according to an embodiment of the present invention.

The encoder 1 is a rotary encoder including a photointerrupter 20 (first photointerrupter) and a photointerrupter 30 (second photointerrupter) that are disposed on a base 10, a slit, disc (slit member, rotary disc) 40, a motor 50, and a controller (power supply controller) 60.

The first photointerrupter 20 and the second photointerrupter 30 operate under the control of the controller 60 and detect the slits of the slit disc 40 to determine the rotational rate of the slit disc 40. The photointerrupters 20 and 30 are each fixed on the base 10 with a phase shift of about ¼ the slit cycle so as to detect the slits of the slit disc 40 at a phase shifted by $\pi/2$ (90 degrees) from the slit of the slit disc 40.

The motor 50 is connected to the controller 60 with a cable (not shown). The motor 50 drives the slit disc 40 and an external member to be rotated, under the control of the controller 60.

The slit disc 40 has slits (transmission regions) 41 disposed at predetermined pitches along the circumference of the slit disc 40 and is driven by the motor 50. The slits (transmission regions) 41 and the non-slit regions (blocking regions) have an identical width and are disposed at regular pitches along the circumferential detection axis (movement axis) 41a indicated by a chain line in the slit disc 40. In this embodiment, 36 slits 41 are disposed every 10 degrees. The number of the slits 41 and the distance between two adjacent slits 41 may be appropriately determined other than those described above. More slits 41 may be disposed at smaller pitches.

The controller 60 controls the operations of the photointerrupters 20 and 30 and the motor 50. The controller 60 is an integrally formed component, such as an IC chip, and includes a microcomputer 61 (refer to FIG. 5) provided with a central processing unit (CPU), a random access memory (RAM), and a storage (non-volatile memory or read-only memory (ROM)). The microcomputer 61 can receive and transmit data and signals with a general-purpose input/output (GPIO) and achieve conversion between digital data and analog signal with a digital-to-analog converter (DAC) and an analog-to-digital converter (ADC) upon the reception or transmission of the data and signals. The controller 60 is connected with a power supply and an oscillation circuit (not shown) to receive electric power and clock signals therefrom.

The mounting angles and the positional relation among the base 10, the photointerrupters 20 and 30, the slit disc 40, and the controller 60 may be appropriately determined.

Figure 2A:
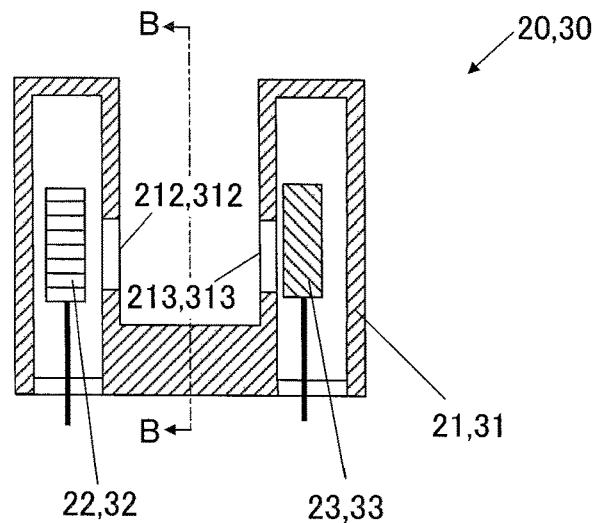
FIG. 2A is a cross-sectional view of a photointerrupter according to the embodiment.
Figure 2B:
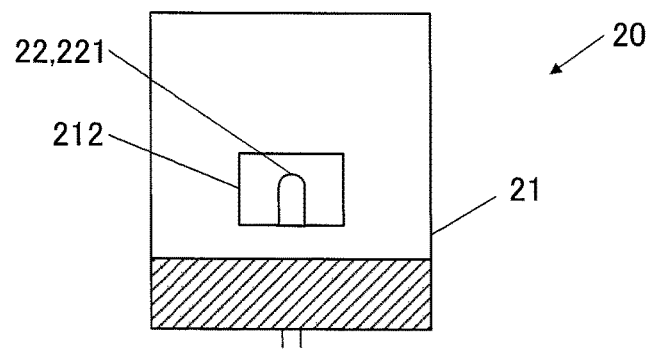
FIG. 2B is a cross-sectional view of a photointerrupter according to the embodiment.
Figure 2C:
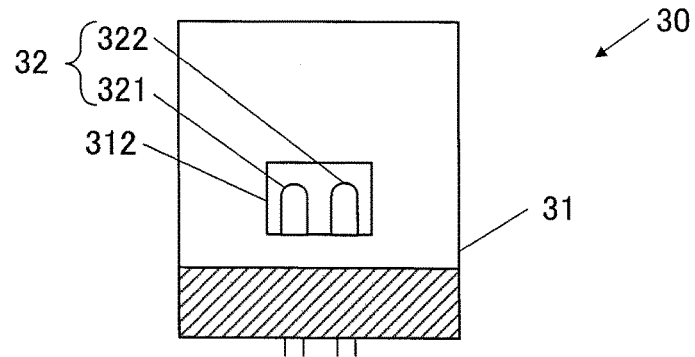
FIG. 2C is a cross-sectional view of a photointerrupter according to the embodiment.

FIGS. 2A to 2C are cross-sectional views of the photointerrupters 20 and 30 according to the embodiment. FIG. 2A is a cross-sectional view of the photointerrupter 20 or 30 taken along a plane (section line A-A in FIG. 1 for the photointerrupter 20) perpendicular to the face of the slit disc 40. The cross-sectional view of the photointerrupter 20 is identical to that of the photointerrupter 30. FIGS. 2B and 2C are cross-sectional views of the photointerrupters 20 and 30, respectively, taken along the section line B-B in FIG. 2A.

The photointerrupter 20 includes a package 21, a first light emitter 22, and a first light receiver 23. The photointerrupter 30 includes a package 31, a second light emitter (a light emitter) 32, and a second light receiver (a light receiver) 33.

The first light emitter 22 and the second light emitter 32 emit light having a predetermined wavelength (infrared light in this embodiment). The first light emitter 22 and the second light emitter 32 each include one or more light sources, such as light emitting diodes (LEDs).

The first light receiver 23 and the second light receiver 33 detect the light from the first light emitter 22 and the second light emitter 32, respectively. The first light receiver 23 and the second light receiver 33 each include, for example, a phototransistor outputting electric current corresponding to the intensity of the light received. Alternatively, the first light receiver 23 and/or the second light receiver 33 may include a photodiode or any other photodetector(s). In this embodiment, the first light receiver 23 and the second light receiver 33 detect the light having a predetermined wavelength, i.e., infrared light, from the first light emitter 22 and the second light emitter 32. If the first light receiver 23 and the second light receiver 33 each include a phototransistor sensitive to light having a different wavelength from the infrared light, the first light receiver 23 and the second light receiver 33 may further include bandpass filters (BPFs) selectively transmitting the infrared light.

The package 21 accommodates the first light emitter 22 and the first light receiver 23 for protection and shields the external light so that the first light receiver 23 can accurately detect the light from the first light emitter 22. The package 31 accommodates the second light emitter 32 and the second light receiver 33 for protection and shields the external light so that the second light receiver 33 can accurately detect the light from the second light emitter 32.

The packages 21 and 31 each have a recessed space in the center. Emitting windows 212 and 312 respectively face receiving windows 213 and 313 through the recessed spaces. The emitting windows 212 and 312 respectively transmit the light beams emitted from the first light emitter 22 and the second light emitter 32. The light beams are allowed to pass through the emitting windows 212 and 313 to enter the first light receiver 23 and the second light receiver 33, respectively. The slit disc 40 is disposed in the recessed spaces. During the rotation of the slit disc 40, the slits 41 and the blocking regions alternately pass through the space between the emitting window 212 and the receiving window 213 (pass over a first optical path) and pass through the space between the emitting window 312 and the receiving window 313 (pass over a second optical path). The first light receiver 23 and the second light receiver 33 periodically detect the respective infrared light beams emitted from the first light emitter 22 and the second light emitter 23. The receiving windows 213 and 313 may be provided with the BPFs described above.

In this embodiment, the leads from the LEDs and the phototransistors are extracted through an opening at one side of each of the packages 21 and 31 and are connected to circuits supplying electric power and detecting currents and voltages. The openings may be sealed after the leads are extracted from the openings. The package 21, the first light emitter 22, and the first light receiver 23 are thereby integrally formed into the photointerrupter 20, and the package 31, the second light emitter 32, and the second light receiver 33 into the photointerrupter 30.

The first light emitter 22 of the photointerrupter 20 includes a single LED 221, as illustrated in FIG. 2B, whereas the second light emitter 32 of the photointerrupter 30 includes two LEDs 321 and 322 (at least two light sources), as illustrated in FIG. 2C. The LEDs 321 and 322 are aligned in parallel along the rotational direction of the slit 41 so as to face the emitting window 312. The positions of the slits 41 and the LEDs 321 and 322 relative to the second light receiver 33 of the photointerrupter 30 is determined such that the second light receiver 33 receives two light beams from the LEDs 321 and 322 when any one of the slits 41 faces the second light receiver 33 at its central area, and a single light beam from the LED 321 or 322 when any one of the slits 41 faces the second light receiver 33 at its one end. The intensity of the light emitted from the LEDs 321 and 322 to the second light receiver 33 disposed at such a position exhibits a substantially continuous fluctuation depending on the light emitting area, the light receiving area, the specular diffraction of the incident light, and other parameters: the light intensity received at the second light receiver 33 is high when any one of the slits 41 faces the second light receiver 33 at its central area, whereas the light intensity received at the second light receiver 33 is low when any one of the slits 41 faces the second light receiver 33 at its one end.

Figure 3A:
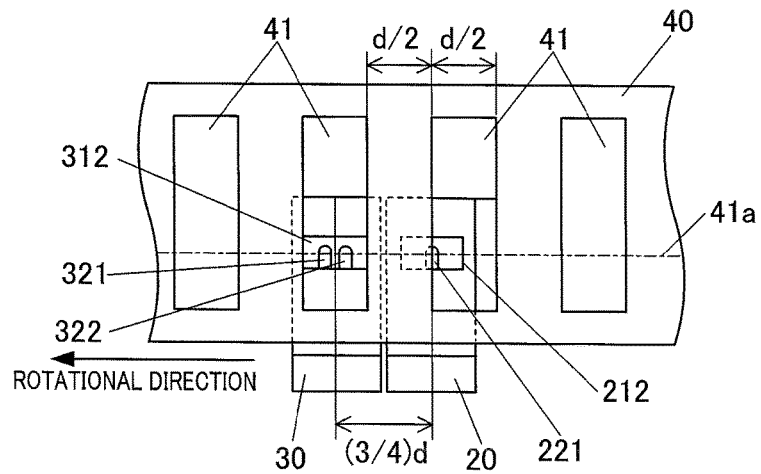
FIG. 3A illustrates a positional relation between the photointerrupters and a slit disc.
Figure 3B:
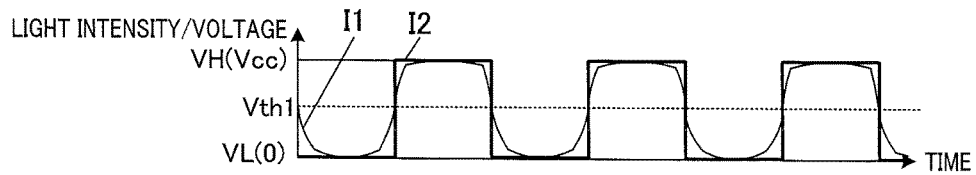
FIG. 3B illustrates an output signal from the photointerrupter.
Figure 3C:
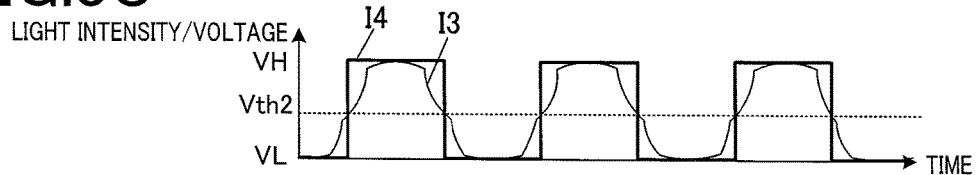
FIG. 3C illustrates an output signal from the photointerrupter.
Figure 3D:
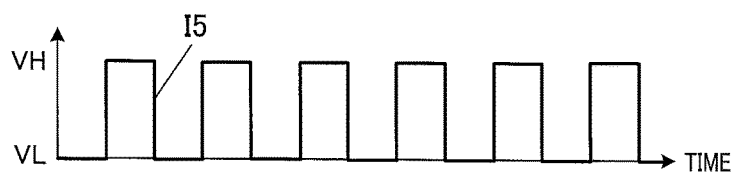
FIG. 3D illustrates an output signal from the photointerrupter.

FIG. 3A illustrates the positional relation of the photointerrupters 20 and 30 to the slit disc 40. FIGS. 3B to 3D illustrate output signals from the photointerrupters 20 and 30. For simplicity, the slit disc 40 and some of the slits 41 of the slit disc 40 are linearly aligned along the detection axis 41a, in FIG. 3A.

With reference to FIG. 3A, each slit 41 moving in the rotational direction of the slit disc 40 passes through the space between the first light emitter 22 and the first light receiver 23 (passes over the first optical path) of the photointerrupter 20, and then passes through the space between the second light emitter 32 and the second light receiver 33 (pass over the second optical path) of the photointerrupter 30. Each slit (transmission region) 41 and each non-slit region (blocking region) of the slit disc 40 has a width of d/2 along the detection axis 41a. In other words, the total width of a slit 41 and an adjacent blocking region (hereinafter referred to as "slit cycle") along the detection axis 41a is indicated by a distance d. The distance from the center of the first light emitter 22 (LED 221) of the photointerrupter 20 to the center of the second light emitter 32 (between the LEDs 321 and 322) of the photointerrupter 30 in the rotational direction of the slit disc 40 is indicated by d×¾. Accordingly, the photointerrupters 20 and 30 are positioned with a delay of ¾ the slit cycle (phase shift of π×3/2) in the rotational direction. In other words, the photointerrupters 20 and 30 are positioned with an advance of ¼ the slit cycle (phase shift of −π/2).

With reference to FIG. 3B, if the first light receiver 23 of the photointerrupter 20 detects the light intensity I1 indicated by the narrow solid line, the binary signal I2 indicated by the thick solid line is determined from the value of the light intensity I1 relative to a reference value (threshold voltage Vth1 indicated by the dotted line in this embodiment). With reference to FIG. 3C, if the second light receiver 33 of the photointerrupter 30 detects the light intensity I3 indicated by the narrow solid line, the binary signal I4 indicated by the thick solid line is determined from the value of the light intensity I3 relative to a reference value (threshold voltage Vth2 indicated by the dotted line). These binary signals generated at the photointerrupters 20 and 30 each have a phase shift of ¼ the slit cycle, as described above; therefore, the pulsed signal I5 indicated by the solid line in FIG. 3D is determined through the exclusive OR operations of these binary signals. The pulsed signal I5 has a rising edge or a falling edge every ¼ slit cycle.

In detail, when the first light receiver 23 faces any one of the slits 41 (or the first light emitter 22) without block of the first optical path by the slit disc 40, at least part of the second light receiver 33 faces the slit disc 40 with block of at least part of the second optical path by the slit disc 40. The region (blocking region) of the slit disc 40 blocking the second optical path is adjacent to the slit 41 passing over the first optical path.

Figure 4:
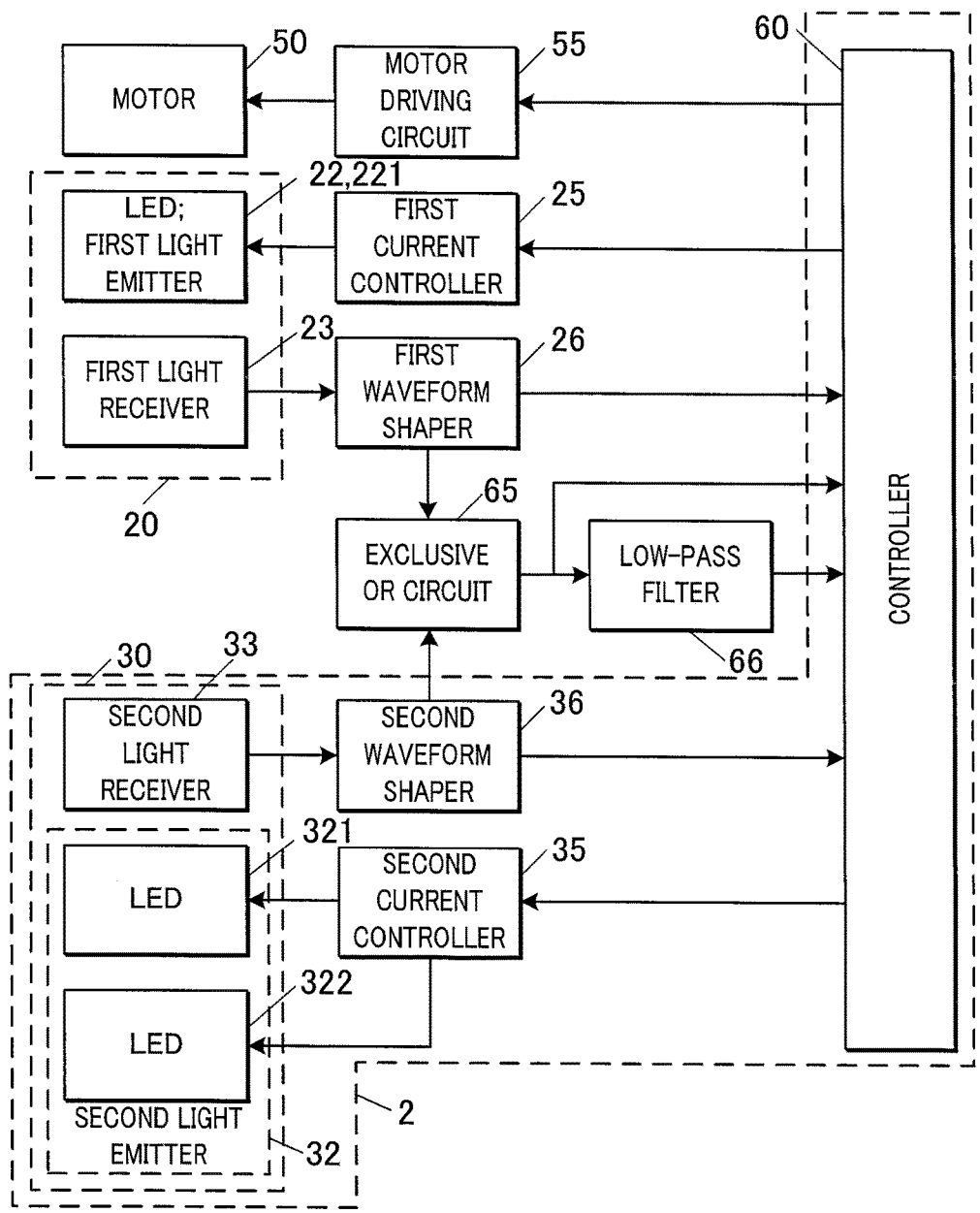
FIG. 4 is a block diagram of the functional configuration of the encoder.

FIG. 4 is a block diagram of the functional configuration of the encoder 1 according to an embodiment.

Besides the photointerrupters 20 and 30, the motor 50, and the controller 60, the encoder 1 includes a motor driving circuit (driver) 55, a first current controller 25, a first waveform shaper 26, a second current controller 35, a second waveform shaper (detection determiner) 36, an exclusive OR circuit 65, and a low-pass filter (average calculator) 66.

The motor driving circuit 55 drives the motor 50 at a predetermined rotational rate based on the control signal from the controller 60.

The first current controller 25 feeds electric current corresponding to the light intensity of the LED 221 to the LED 221 of the photointerrupter 20.

The first waveform shaper 26 generates a voltage corresponding to the intensity of the light received at the first light receiver 23 of the photointerrupter 20, binarizes the voltage based on a predetermined threshold voltage (Vth1), and outputs the binary voltage. In this embodiment, the low-level voltage VL corresponds to the grounding voltage (0V), whereas the high-level voltage VH corresponds to the voltage of the constant-voltage power supply Vcc.

The second current controller 35 feeds electric currents corresponding to the light intensities of the LEDs 321 and 322 to the LEDs 321 and 322 of the photointerrupter 30.

The second waveform shaper 36 generates a voltage corresponding to the intensity of the light received at the second light receiver 33 of the photointerrupter 30, binarizes the voltage based on a predetermined threshold voltage (Vth2), and outputs the binary voltage. The high-level voltage VH and the low-level voltage VL of the binary signal from the second waveform shaper 36 are the same as those from the first waveform shaper 26.

The exclusive OR circuit 65 outputs the results of the exclusive OR operations of the binary signals from the first waveform shaper 26 and the second waveform shaper 36.

The low-pass filter (hereinafter also referred to as "LPF") 66 passes a frequency signal having a time length required for at least one slit cycle (i.e., detection cycle of a slit 41 and an adjacent blocking region). The low-pass filter 66 thereby outputs the average value (average voltage) of the logic signals from the exclusive OR circuit 65.

The controller 60 controls the driving operation of the motor driving circuit 55 or the rotational rate of the motor 50 and the intensities of the light from the LEDs 221, 321, and 322, based on the outputs from the first waveform shaper 26, the second waveform shaper 36, and the exclusive OR circuit 65, and the low-pass filter 66.

The second waveform shaper 36 and the controller 60 function as a voltmeter of the photointerrupter 30 and a second voltmeter of the encoder (driving operation detector) 1. The first waveform shaper 26 and the controller 60 function as a first voltmeter of the encoder (driving operation detector) 1.

The second current controller 35 and the controller 60 function as a power supply for the photointerrupter 30. The first current controller 25, the second current controller 35, and the controller 60 function as a power supply for the encoder 1 as a driving operation detector.

Figure 5:
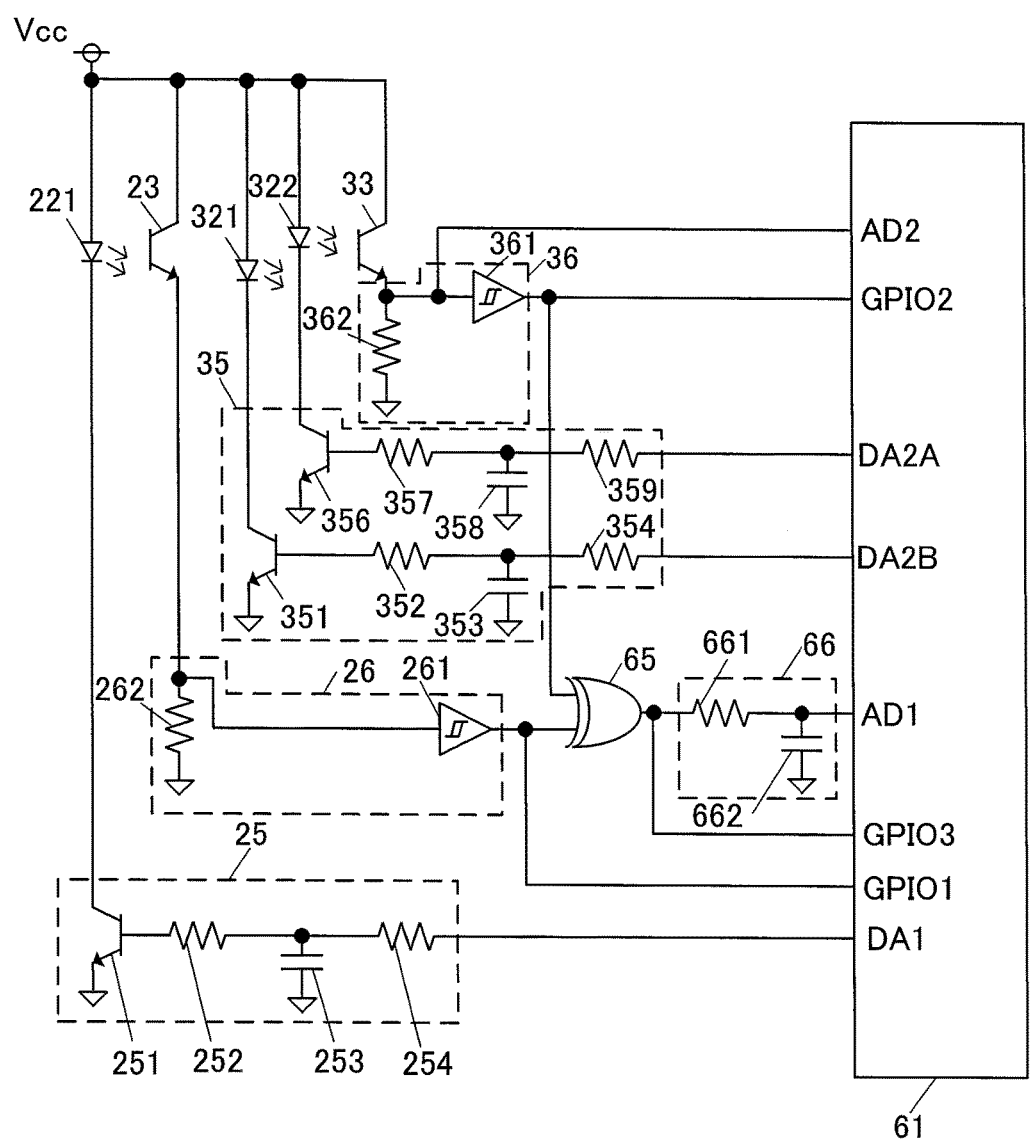
FIG. 5 is an exemplary circuit of the encoder.

FIG. 5 is an exemplary circuit of the encoder 1 according to the embodiment.

The first current controller 25, which controls the current to be fed to the LED 221, includes a bipolar transistor 251, resistors 252 and 254, a capacitor 253, and other elements. The collector of the bipolar transistor 251 is connected to the cathode of the LED 221, and the emitter of the bipolar transistor 251 is grounded. The first current controller 25 feeds a predetermined current between the base and the emitter of the bipolar transistor 251 to control the current rate or light intensity of the LED 221. The predetermined current is determined with the resistors 252 and 254 based on the analog signal voltage output from the D/A converter DA1 (i.e., the inter-plate voltage of the capacitor 253) in the microcomputer 61.

Likewise, the second current controller 35, which controls the current to be fed to the LEDs 321 and 322, includes bipolar transistors 351 and 356, resistors 352, 354, 357, and 359, capacitors 353 and 358, and other elements. The collectors of the bipolar transistors 351 and 356 are respectively connected to the cathodes of the LEDs 321 and 322, and the emitters of the bipolar transistors 351 and 356 are grounded. The second current controller 35 feeds predetermined currents corresponding to the respective analog signal voltages output from the D/A converters DA2A and DA2B in the microcomputer 61 between the bases and the emitters of the bipolar transistors 351 and 356 to control the current rates (light intensities) of the LEDs 321 and 322.

The phototransistor of the first light receiver 23 is connected to the constant-voltage power supply Vcc at one end, and is connected to the first waveform shaper 26 at the other end. The phototransistor of the second light receiver 33 is connected to the constant-voltage power supply Vcc at one end, and is connected to the second waveform shaper 36 at the other end.

The first waveform shaper 26 includes a resistor 262, a comparator 261, and other elements. The second waveform shaper 36 includes a resistor 362, a comparator 361, and other elements. The resistors 262 and 362 are connected to the respective phototransistors at one ends, and are grounded at the other ends.

The comparators 261 and 361 of the first and second waveform shapers 26 and 36 respectively binarize the voltage differences between the two terminals of the resistors 262 and 362 generated corresponding to the currents from the phototransistors, based on predetermined reference values (predetermined threshold voltages). The first and second waveform shapers 26 and 36 then output the binary voltages. In this embodiment, the comparators 261 and 361 each include a hysteresis circuit. The comparator exhibiting a high hysteresis detects rising edges and falling edges at timings deviated from correct timings. The deviated timings need to be adjusted.

The binary signals from the first waveform shaper 26 and the second waveform shaper 36 are directly sent to GPIO1 and GPIO2 in the microcomputer 61, respectively. The binary signals are sent to the exclusive OR circuit 65, which operates the exclusive OR of the binary signals. The results of the exclusive OR operations are sent to the GPIO3 of the microcomputer 61 and the LPF 66.

The signal not binarized at the second waveform shaper 36 is directly sent to the microcomputer 61 and is converted into a digital signal at the A/D converter AD2. The digital signal is used for detection of a phase shift based on the offset value of the detected light intensity, for example.

The LPF 66 outputs the average value of the binary signals. In this embodiment, the LPF 66 is a common CR circuit which includes a resistor 661 connected to the output of the exclusive OR circuit 65 and a capacitor 662 disposed between the output side of the resistor 661 and the ground plane. For the calculation of the average value, the motor 50 may be driven at a predetermined rotational rate, in general. If the motor 50 is driven at various rotational rates for the calculation of the average value, the cutoff frequency should be variable. In detail, any one of the resistance of the resistor 661 and the capacitance of the capacitor 662 may be variable.

The output from the LPF 66 is sent to the microcomputer 61 and is converted into a digital signal at the A/D converter AD1.

The circuitry configuration (including the first current controller 25, the second current controller 35, the first waveform shaper 26, the second waveform shaper 36, the exclusive OR circuit 65, the LPF 66, and the microcomputer 61 (controller 60)) in association with the operations of the photointerrupters 20 and 30 (including LEDs 221, 321, and 322, and the light receivers 23 and 33) function as a light adjuster.

The photointerrupter 30 and the components (the second current controller 35, the second waveform shaper 36, and the microcomputer 61 (controller 60)) in association with the operation of the photointerrupter 30 function as an optical sensor 2 (illustrated in FIG. 4).

The operation for adjusting the detection of the rotational rate at the encoder 1 according to the embodiment will now be described.

FIGS. 6A to 6D illustrate waveforms for adjusting the operation.

To determine the speed (positional) information of the object in quadruple precision relative to the slit cycle (distance d) with the encoder 1 according to the embodiment, the distance from the center of the first light emitter 22 of the photointerrupter 20 to the center of the second light emitter 32 of the photointerrupter 30 should be exact ¾ the slit cycle in the rotational direction of the slits 41, as described above. Such an exact positional adjustment of the photointerrupter 20 and the photointerrupter 30, however, involves an immense effort. In the embodiment, the distance from the photointerrupter 20 to the photointerrupter 30 of the encoder 1 is determined to be about ¾ the slit cycle, and the light intensities, in particular the proportion of the light intensities, of the LEDs 321 and 322 of the second light emitter 32 in the photointerrupter 30 are finely tuned to modify the fluctuation (chronological variation) of the light intensity received at the second light receiver 33. Such tuning of the light intensities changes the timings of the rising edges and falling edges of the binary signal generated at the second waveform shaper 36.

Figure 6A:
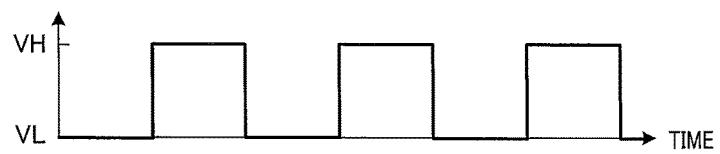
FIG. 6A is an exemplary waveform for illustrating an adjusting operation.
Figure 6B:
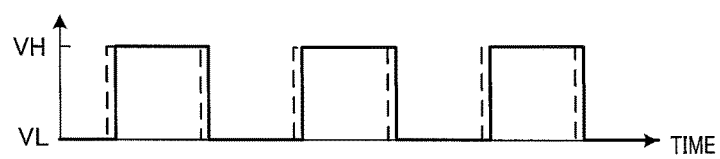
FIG. 6E is an exemplary waveform for illustrating the adjusting operation.
FIG. 6C is an exemplary waveform for illustrating the adjusting operation.
FIG. 6D is an exemplary waveform for illustrating the adjusting operation.

The following description focuses on an exemplary case where the light intensity received at the first light receiver 23 is binarized into a signal in FIG. 6A and the light intensity received at the second light receiver 33 is binarized into a signal indicated by a solid line in FIG. 6B. The binary signal indicated by the solid line in FIG. 6B has rising edges and falling edges at retarded timings, compared to the signal indicated by the dashed line in FIG. 6B, which has an advance of π/2 phase (¼ slit cycle). In other words, the distance between the photointerrupters 20 and 30 is larger than d×¾.

Figure 6C:
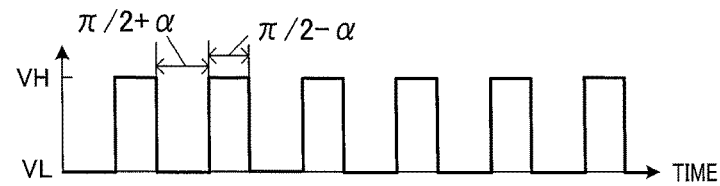

In the exemplary case, the period between each rising edge and the next falling edge decreases (phase difference of $(\pi/2)-\alpha$), whereas the period between each falling edge and the next rising edge increases (phase difference of $(\pi/2)+\alpha$), in the output signal from the exclusive OR circuit 65, as illustrated in FIG. 6C. In other words, the duration for outputting the low-level voltage VL increases, and the detection cycle does not accurately synchronize with ¼ the slit cycle (($\pi$/2)×N phase, where N is an integer).

In contrast, if the distance between the photointerrupters 20 and 30 is shorter than ¾×d, the period between each rising edge and the next falling edge increases, whereas the period between each falling edge and the next rising edge decreases, in the output signal from the exclusive OR circuit 65 (in other words, the duration for outputting the high-level voltage VH increases).

Figure 6D:
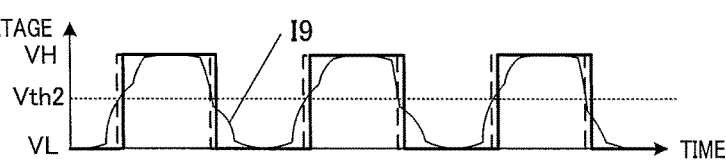

The encoder 1 according to the embodiment determines if the distance between the photointerrupters 20 and 30 is larger or smaller than d×¾ (in this embodiment, the distance is larger than d×¾), based on the difference between the average value per slit cycle generated at the exclusive OR circuit 65 and the mean value of the high-level voltage VH and the low-level voltage VL (two edge voltages). As shown in FIG. 6D illustrating the light intensity I9 indicated by the narrow solid line, the light intensity of the LED 322, which is disposed posterior to the LED 321 in the rotational direction of the slit disc 40, is tuned to be higher than that of the LED 321, which is disposed anterior to the LED 322 in the rotational direction. When the slit disc 40 is rotated and a slit 41 passes over a second optical path, the second light receiver 33 first receives the light from the posterior LED 322 and subsequently receives the light from the anterior LED 32. Accordingly, the second light receiver 33 detects an increased light intensity at the timing of a rising edge and a reduced light intensity at the timing of the immediate falling edge, so that the binary signal output from the second light receiver 33 is advanced in phase. Such an appropriate tuning of the light intensities allows the phase of the binary signal output from the second light receiver 33 to be shifted by $\pi$/2 or ¼ the slit cycle from the binary signal output from the first light receiver 23.

FIG. 7 is a flow chart illustrating the procedure of the phase adjustment to be executed in the encoder 1 according to the embodiment with the controller 60.

The phase adjustment starts in response to automatic satisfaction of a predetermined condition, for example, the first power feeding of the day or a predetermined input operation by a user.

During the phase adjustment, the controller (CPU) 60 transmits a control signal to the motor driving circuit 55 to drive the motor 50 at a constant rotational rate (Step S101). The controller 60 acquires the average value Vh of the outputs of the exclusive OR circuit 65 from the A/D converter AD1 (Step S102).

The controller 60 determines whether the average value Vh is smaller than the intermediate value (Vcc/2) between the high-level voltage VH (Vcc) and the low-level voltage VL (0) of the binary signal (Step S103). In other words, the controller 60 determines whether the duration of the low-level voltage is longer than the duration of the high-level voltage in the output from the exclusive OR circuit 65. If the average value Vh is smaller than the intermediate value (Vcc/2) ("YES" in Step S103), the controller 60 increases the light intensity of the LED 322 (posterior to the LED 321 in the rotational direction, referred to as "posterior LED" in FIG. 7) and reduces the light intensity of the LED 321 (anterior to the LED 322 in the rotational direction, referred to as "anterior LED" in FIG. 7), so that the rising edges and falling edges of the binary signal from the second light receiver 33 are advanced in phase (Step S113). The procedure by the controller 60 returns to Step S102.

If the average value Vh is not smaller than the intermediate value (Vcc/2) ("NO" in Step S103), the controller 60 determines whether the average value Vh is larger than the intermediate value (Vcc/2) (Step S104). In other words, the controller 60 determines if the duration of the high-level voltage is longer than the duration of the low-level voltage in the output from the exclusive OR circuit 65. If the average value Vh is larger than the intermediate value (Vcc/2) ("YES" in Step S104), the controller 60 increases the light intensity of the LED 321 (anterior to the LED 322 in the rotational direction, referred to as "anterior LED" in FIG. 7) and reduces the light intensity of the LED 322 (posterior to the LED 321 in the rotational direction, referred to as "posterior LED" in FIG. 7), so that the rising edges and falling edges of the binary signal from the second light receiver 33 are delayed in phase (Step S114). The procedure by the controller 60 returns to Step S102.

If the average value Vh is not larger than the intermediate value (Vcc/2) ("NO" in Step S104), the controller 60 determines whether the rising edges and falling edges of the binary signal from the exclusive OR circuit 65 are detected at regular pitches (Step S105). If the rising and falling edges are not detected at regular pitches ("NO" in Step S105), the controller 60 adjusts the light intensities of the LEDs 321 and 322 because the total intensity of the light emitted from the LEDs 321 and 322 is inappropriate (Step S115). The procedure by the controller 60 returns to Step S102.

If the rising and falling edges are detected at regular pitches ("YES" in Step S105), the controller 60 causes the motor driving circuit 55 to stop the operation of the motor 50 (Step S106), and the phase adjustment is completed.

It should be noted that an exact difference between the average value Vh and the intermediate value (Vcc/2) needs not to be determined in Steps S103 and S104; the difference may include a predetermined margin of error. The margin of error may be appropriately determined based on the accuracy required for the encoder 1.

As described above, the photointerrupter 30 according to the embodiment includes the second light emitter 32 emitting light and the second light receiver 33 receiving the light from the second light emitter 32 integrally formed with each other. The second light emitter 32 includes at least two LEDs (321 and 322). At least one of the LEDs can be individually tuned in light intensity.

If the distance between the photointerrupters is slightly different from a desired distance, the proportion of the light intensities of the LEDs 321 and 322 are adjusted without an actual positional adjustment of the photointerrupters. The data on a phase shift determined after the tuning of the light intensities has an accuracy equivalent to that of the data determined after an actual positional adjustment of the photointerrupters to the desired distance. The encoder including such photointerrupters can readily determine the movement of the object with higher accuracy.

The optical sensor 2 according to the embodiment includes the photointerrupter 30 and the light adjuster tuning the light intensities of the at least two LEDs (321 and 322). The light adjuster includes the second current controller 35, the second waveform shaper 36, and the controller 60. The second current controller 35 and the controller 60 feed electric power to the photointerrupter 30. The second waveform shaper 36 and the controller 60 detect a voltage corresponding to the intensity of the light received at the second light receiver 33. The controller 60 controls the electric power to be fed to the photointerrupter 30.

The light intensities of the LEDs 321 and 322 can be readily tuned in association with the intensity or the fluctuation of the intensity of the received light. Such tuning of the light intensities facilitates fine adjustment of the detection timings of the slits at the optical sensor 2. Accordingly, the phase adjustment can be readily achieved without an exact positional adjustment of the photointerrupters. The combination of such an optical sensor 2 and any other photointerrupter (optical sensor) can function as a high-accuracy encoder.

The second waveform shaper 36 includes the comparator 361 binarizing the detected voltage based on a reference value (predetermined threshold voltage). The comparator 361 binarizes the voltage corresponding to the detected light intensity into a signal having rising edges and falling edges at appropriate timings. The timings of passing of the edges of the slits 41 can be determined from the binary signal.

The encoder 1 according to the embodiment includes the photointerrupter 20 which includes the first light emitter 22 emitting light and the first light receiver 23 receiving the light from the first light emitter 22 integrally formed with each other, the photointerrupter 30, the light adjuster tuning the light intensities of the at least two LEDs (321 and 322), and the slit disc 40 having the slits 41 transmitting light and the blocking regions (non-slit regions of the slit disc 40) blocking light. The slits 41 and the blocking regions of the slit disc 40 have an identical width and are alternately disposed at regular pitches along the detection axis 41a. The slit disc 40 moves along the detection axis 41a in conjunction with the operation of the motor driving circuit 55. During the rotation of the slit disc 40 along of the detection axis 41a, the slits 41 and the blocking regions alternately pass over the first optical path from the first light emitter 22 to the first light receiver 23 and the second optical path from the second light emitter 32 to the second light receiver 33.

As described above, the encoder 1 includes two or more photointerrupters 20 and 30, and at least one of the photointerrupters includes the at least two LEDs (321 and 322) that are tunable in light intensity. Such tuning of the light intensities can generate an appropriate phase shift without an exact adjustment of the distance between the photointerrupters 20 and 30, and can readily provide the kinetic (movement) information of the object in an accuracy depending on the phase shift.

The photointerrupter 20 and the photointerrupter 30 are positioned such that the second optical path is partly blocked by at least part of the blocking region when any one of the slits 41 passes over the first optical path. Such photointerrupters 20 and 30 disposed in different phases facilitate an accurate determination of the movement and moving direction of the object.

In addition, the blocking region blocking at least part of the second optical path is adjacent to the slit 41 passing over the first optical path. Such photointerrupters 20 and 30 positioned with a phase difference of less than one slit cycle ($2\pi$ phase) facilitates the phase adjustment.

The light adjuster includes the first current controller 25, the second current controller 35, the first waveform shaper 26, the second waveform shaper 36, and the controller 60. The first current controller 25, the second current controller 35, and the controller 60 feed electric power to the photointerrupters 20 and 30. The first waveform shaper 26 and the controller 60 detect a voltage corresponding to the intensity of the light received at the first light receiver 23. The second waveform shaper 36 and the controller 60 detect a voltage corresponding to the intensity of the light received at the second light receiver 33. The controller 60 operates as a power supply controller controlling electric power to be fed to the photointerrupters 20 and 30.

Such an individual and appropriate control of the light intensities of the LEDs 321 and 322 of the photointerrupter 30 based on the data on the light intensities detected at the photointerrupters 20 and 30 can accurately adjust the phases of the photointerrupters 20 and 30, facilitating acquisition of a high-accuracy measurement of the movement of the object.

The first waveform shaper 26 and the second waveform shaper 36 each binarize the detected voltage based on the threshold value. The phases of the binary signals are adjusted as described above, so that the binary signals have rising edges and falling edges at appropriate timings. The phases of the rectangular wave signals thereby can be readily and accurately adjusted without any adjustment of the entire waveforms, resulting in acquisition of high-accuracy movement information of the object.

The light adjuster also includes the exclusive OR circuit 65 outputting the results of the exclusive OR operations of the binary signals from the first waveform shaper 26 and the second waveform shaper 36. Such a configuration facilitates acquisition of a rectangular wave signal in quadruple precision relative to the slit cycle.

The light adjuster also includes the LPF 66 averaging the outputs from the exclusive OR circuit 65 in the detection cycle of a slit 41 and an adjacent blocking region of the slit disc 40 rotating at a predetermined rate. The detection cycle is determined at the photointerrupters 20 and 30. If the phase difference between the rectangular wave generated at the first waveform shaper 26 and the rectangular binary wave generated at the second waveform shaper 36 is deviated from a $\pi/2$ phase, the average value of the outputs from the exclusive OR circuit 65 is deviated from the intermediate value (Vcc/2) between the high-level voltage VH (Vcc) and the low-level voltage VL (0V). Based on the deviation, the phase shift and the direction of the phase shift can be readily identified.

The controller 60 (microcomputer 61) functioning as a power supply controller also modifies the light intensities of at least one of the at least two LEDs (321 and 322) in the second light emitter 32, based on the difference between the average voltage determined at the LPF 66 and the mean value (intermediate value Vcc/2) of the two edge voltages of the binary signal.

As described above, the phase shift caused by inexact positional relation between the photointerrupters 20 and 30 can be readily identified and adjusted through the tuning of the light intensities and the proportion of the light intensities of the LEDs 321 and 322. The encoder 1 according to the embodiment thus can determine the movement of the object in quadruple precision relative to the slit cycle without an exact positional adjustment.

The controller 60 (microcomputer 61) functioning as a power supply controller also modifies the light intensities of the LEDs 321 and 322 such that the average voltage of the outputs from the exclusive OR circuit 65 is equal to the mean value (intermediate value Vcc/2) of the high-level voltage and the low-level voltage (two edge voltages).

Such tuning of the light intensities can adjust the phase of the output from the exclusive OR circuit 65 so that the output signal has rising edges and falling edges at regular pitches. Accordingly, the movement information of the object can be provided in quadruple precision relative to the slit cycle.

The slit disc 40 is a rotary disc driven by the motor driving circuit 55. The slit disc 40 has the circular detection axis 41a. The encoder including such a rotary disc according to the embodiment of the present invention can provide high-accuracy information on the movement of the object for a long period during the rotation of the motor 50. The encoder can effectively reduce the errors in a short-distance movement and the accumulated rotational errors.

It should be noted that the present invention can have any modification other than the embodiments described above.

For example, the second light emitter 32 of the photointerrupter 30, which includes two LEDs in the embodiment described above, may have two or more LEDs. In such a case, all of the LEDs may not be individually tunable in light intensity. For example, the second light emitter 32 may include three LEDs disposed in the rotational direction, and two of the three LEDs disposed on the both sides of the remaining one in the rotational direction may be individually tunable in light intensity.

In the embodiments described above, the data on the detected light intensity is binarized into a high-level voltage and a low-level voltage based on a predetermined reference value; alternatively, high-level pulsed signals may be output for a short period only at the timings of the rising edges and the falling edges, whereas the low-level is maintained at the other timings. In this case, taking a logical sum of the signals from the photointerrupters 20 and 30 can provide the movement information of the object in quadruple precision relative to the slit cycle.

The light sources in the embodiments described above are common LEDs. The light sources may be organic light emitting diodes (OLEDs).

The encoder according to the embodiments described above determines the kinetic information of the object in quadruple precision relative to the cycle of the slit 41 with the two photointerrupters 20 and 30 positioned with a phase shift of ¼ cycle ($\pi/2$ phase) of the cycle of the slit 41; this is a non-limiting example of the present invention. For example, the encoder may include three photointerrupters positioned with a phase shift of ⅙ slit cycle ($\pi/3$ phase) to determine the positional information of the object in sextuple precision relative to the cycle of the slit 41. In other words, any number of photointerrupters according to the embodiment of the present invention may be provided in the encoder. The distance between the photointerrupters 20 and 30 positioned with a phase shift of $\pm\pi/2$ may be other than ¾ the cycle of the slit 41. The distance may be 5/4 or 7/4 the cycle of the slit 41, for example.

In the embodiments described above, the kinetic information in quadruple precision is determined from the outputs from the exclusive OR circuit, and the direction of the positional shift of the photointerrupters 20 and 30 is identified from the average value per slit cycle of the outputs. Alternatively, the kinetic information and the direction of the positional shift may be determined through any other scheme; for example, the kinetic information may be determined with a flip-flop circuit, and the distance between each rising edge and the immediate falling edge of the signal may be directly measured with a counter circuit to identify the shift and the direction of the shift of the photointerrupters 20 and 30.

In the embodiments described above, the photointerrupter 20 includes a single common LED in the first light emitter 22; however, the photointerrupter 20 may include two or more LEDs, like the photointerrupter 30.

The encoder according to the embodiments described above is a rotary encoder including the slit rotary disc 40; however, the encoder may be of any other type, for example, a linear type.

The configurations, structures, controls, and control procedures described above may be appropriately modified in the range without departing from the scope of the present invention.

In the above, some embodiments of the present invention are described. However, the scope of the present invention is not limited thereto. The scope of the present invention includes the scope of claims below and the scope of their equivalents.

What is claimed is:

1. An optical sensor comprising:
    a photointerrupter comprising a light emitter and a light receiver integrally formed with each other, wherein
        the light emitter comprises at least two light sources and emits light, at least one of the at least two light sources being individually tunable in light intensity; and
        the light receiver receives the light from the light emitter; and
    a light adjuster tuning the light intensities of the at least two light sources, the light adjuster comprising:
        a power supply feeding electric power to the photointerrupter;
        a voltmeter detecting a voltage corresponding to light intensity received at the light receiver; and
        a power supply controller controlling electric power to be fed from the power supply.

2. The optical sensor according to claim 1,
    wherein the voltmeter comprises a detection determiner binarizing the detected voltage based on a predetermined threshold voltage.

3. A driving operation detector comprising:
    a first photointerrupter comprising a first light emitter and a first light receiver integrally formed with each other, wherein
        the first light emitter emits light; and
        the first light receiver receives the light emitted from the first light emitter;
    a second photointerrupter comprising a second light emitter and a second light receiver integrally formed with each other, wherein
        the second light emitter comprises at least two light sources and emits light, at least one of the at least two light sources being individually tunable in light intensity; and
        the second light receiver receives the light emitted from the second light emitter;
    a light adjuster tuning the light intensities of the at least two light sources; and
    a slit member comprising a plurality of transmission regions transmitting light and a plurality of blocking regions blocking light,
        each of the plurality of transmission regions and the plurality of blocking regions having an identical width, being alternately disposed at regular intervals along a predetermined movement axis, and moving along the movement axis in conjunction with the operation of a driver, and the plurality of transmission regions and the plurality of blocking regions alternately passing over a first optical path from the first light emitter to the first light receiver and a second optical path from the second light emitter to the second light receiver during movement of the slit member along the movement axis.

4. The driving operation detector according to claim 3,
    wherein the first photointerrupter and the second photointerrupter are positioned such that the second optical path is partly blocked by at least one of the plurality of blocking regions when any one of the transmission regions passes over the first optical path.

5. The driving operation detector according to claim 4, wherein the at least one of the plurality of blocking regions blocking at least part of the second optical path is adjacent to the at least one of the plurality of transmission regions passing over the first optical path.

6. The driving operation detector according to claim 3, wherein the light adjuster comprises:
   a power supply feeding electric power to the first photointerrupter and the second photointerrupter;
   a first voltmeter detecting a voltage corresponding to the intensity of the light received at the first light receiver;
   a second voltmeter detecting a voltage corresponding to the intensity of the light received at the second light receiver; and
   a power supply controller controlling electric power to be fed from the power supply.

7. The driving operation detector according to claim 6, wherein the first voltmeter and the second voltmeter each binarize the detected voltage based on a predetermined threshold voltage.

8. The driving operation detector according to claim 7, wherein the light adjuster comprises an exclusive OR circuit outputting results of exclusive OR operations of the binary signals from the first voltmeter and the second voltmeter.

9. The driving operation detector according to claim 8, wherein the light adjuster comprises an average calculator averaging the outputs from the exclusive OR circuit in every detection cycle of a transmission region and an adjacent blocking region of the slit member moving at a predetermined rate, the detection cycle being determined by the first photointerrupter and the second photointerrupter.

10. The driving operation detector according to claim 9, wherein the power supply controller modifies the light intensities of at least one of the at least two light sources in the second light emitter based on a difference between the average voltage determined at the average calculator and mean value of two edge voltages of the binary signal.

11. The driving operation detector according to claim 10, wherein the power supply controller modifies the light intensities such that the average voltage is equal to the mean value of the two edge voltages.

12. The driving operation detector according to claim 3, wherein
   the slit member is a rotary disc rotatively driven by the driver, and
   the movement axis is circular.

* * * * *